United States Patent
Miyamoto et al.

(10) Patent No.: US 6,355,984 B2
(45) Date of Patent: Mar. 12, 2002

(54) INPUT-OUTPUT CIRCUIT CELL AND SEMICONDUCTOR INTEGRATED CIRCUIT APPARATUS

(75) Inventors: Kazuhisa Miyamoto, Hadano; Ryo Yamagata, Sagamihara; Takayuki Uda, Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/828,193

(22) Filed: Apr. 9, 2001

Related U.S. Application Data

(63) Continuation of application No. 09/648,485, filed on Aug. 28, 2000, now Pat. No. 6,222,278, which is a continuation of application No. 08/987,771, filed on Dec. 9, 1997, now Pat. No. 6,121,687.

(30) Foreign Application Priority Data

Dec. 12, 1996 (JP) ............................................... 8-331947

(51) Int. Cl.$^7$ ........................... H01L 29/80; H01L 3/112
(52) U.S. Cl. ....................... 257/777; 257/778; 257/686; 257/723; 257/724; 257/203
(58) Field of Search .................................. 257/778, 777, 257/685, 686, 203, 723, 724

(56) References Cited

U.S. PATENT DOCUMENTS

| | | | | |
|---|---|---|---|---|
| 4,746,966 | A | | 5/1988 | Fitzgerald et al. |
| 4,959,704 | A | * | 9/1990 | Isomura et al. |
| 4,994,902 | A | * | 2/1991 | Okahashi et al. |
| 5,341,049 | A | | 8/1994 | Shimizu et al. |
| 5,408,129 | A | * | 4/1995 | Farmwald et al. |
| 5,952,726 | A | | 9/1999 | Liang |
| 6,150,724 | A | * | 11/2000 | Wenzel et al. |
| 6,222,212 | B1 | * | 4/2001 | Lee et al. |
| 6,255,736 | B1 | * | 7/2001 | Kaneko |
| 6,295,230 | B1 | * | 9/2001 | Madurawe et al. |

* cited by examiner

Primary Examiner—Sheila V. Clark
(74) Attorney, Agent, or Firm—Antonelli, Terry, Stout & Kraus, LLP

(57) ABSTRACT

An input-output circuit cell includes an input-output circuit formed on a semiconductor chip and having a signal terminal and an electric source terminal and a plurality of input-output bumps connected to the signal and electric-source terminals of the input-output circuit through wirings respectively, the plurality of input-output bumps being made to correspond to the input-output circuit and arranged at a center in a plane of projection of the input-output circuit. Accordingly, the input-output circuit is disposed in an arbitrary position on the semiconductor chip.

7 Claims, 5 Drawing Sheets

III—III

IV – IV

V – V

INPUT-OUTPUT CIRCUIT CELL AND SEMICONDUCTOR INTEGRATED CIRCUIT APPARATUS

CROSS-REFERENCE TO RELATED APPLICATION

This application is a continuation of application Ser. No. 09/648,485, filed on Aug. 28, 2000 now U.S. Pat. No. 6,222,278, the entire disclosure of which is hereby incorporated by reference which is a continuation of application Ser. No. 08/987,771, filed Dec. 9, 1997, now U.S. Pat. No. 6,121,687.

BACKGROUND OF THE INVENTION

The present invention relates to an input-output circuit cell and a semiconductor integrated circuit apparatus.

In a semiconductor integrated circuit apparatus such as a one-chip CPU, or the like, not only a logical device unit and a memory unit but also an external interface unit for interface connection to the outside and an input-output circuit unit serving as a buffer between the external interface unit and an input-output terminal of the outside are formed on one semiconductor chip.

The input-output terminal of an input-output circuit constituting an input-output circuit unit is connected to an input-output bump by means of wiring in a multilayer wiring substrate. Generally, the pitch interval of input-output bumps is made equal to the pitch interval of pins formed in a package. On the other hand, the size of an input-output circuit is determined on the basis of load drive force for driving circuit species or external devices and in accordance with the available semiconductor process, so that the pitch interval of input-output circuits is different from the pitch interval of input-output bumps. Accordingly, when input-output circuits are to be arranged on a semiconductor chip, it is necessary to match the pitch interval of the input-output circuits with the pitch interval of the input-output bumps (that is, the pitch interval of pins in the package). Assuming now that the pitch interval of pins in the package (that is, the pitch interval of the input-output bumps) is 300 μm and the pitch interval of the input-output circuits is 180 μm, then the least common multiple of the two is calculated and input-output bumps and input-output circuits are arranged collectively in design of layout so that six input-output circuits are made to correspond to six pins (six input-output bumps) in the package in a distance of 1800 μm.

As described above, in the semiconductor integrated circuit apparatus, input-output circuits cannot be arranged arbitrarily on the semiconductor chip because the pins of the package and the input-output circuits are designed to be arranged collectively in design of layout.

Further, because the pins of the package and the input-output circuits must be arranged collectively in design of layout, the input-output circuits are arranged, for example, at the periphery of the semiconductor chip, that is, at four corners of the square semiconductor chip. In the system having input-output circuits arranged at the periphery of the semiconductor chip, an external interface unit must be, however, arranged near the center of the semiconductor chip so that the distances from the input-output circuits arranged at the four corners are kept equal. As a result, with the advance of the increase of the chip size, the distances between the external interface unit and the input-output circuits increase, so that propagation delay increases. Particularly when the semiconductor integrated circuit apparatus is applied to a high-performance CPU, overhead on performance increases. Further, in the system having input-output circuits mounted at the periphery of the semiconductor chip, the number of input-output bumps allowed to be arranged in one side is limited on the basis of the size of the semiconductor chip and the pitch interval of the input-output bumps. That is, the number of input-output terminals is limited.

With the advance of the integration of LSIs on the basis of the recent semiconductor refining technique, a central processing unit (CPU), and so on, are integrated into one chip and the number of input-output terminals required for one chip is showing a tendency to increase. Accordingly, in the system having input-output circuits mounted at the periphery of the semiconductor chip, the number of input-output terminals is limited to the order of hundreds of terminals.

On the contrary, as another method for arranging pins of the package and input-output circuits collectively in design of layout, for example, there is known a method in which input-output circuits are arranged in the form of stripes in the inside of the semiconductor chip. If eight input-output circuits are arranged in the form of stripes in the inside of the semiconductor chip, the number of input-output terminals can be doubled compared with the system having input-output circuits arranged at four corners of the semiconductor chip. By the arrangement of input-output circuits in the form of stripes in the inside of the semiconductor chip, the distances between the external interface unit disposed at the center of the semiconductor chip and the input-output circuits can be relatively reduced compared with the aforementioned system. Accordingly, propagation delay can be reduced. In the system having input-output circuits arranged in the form of stripes in the inside of the semiconductor chip, however, a logic unit is separated by the input-output circuits arranged in the form of stripes. As a result, overhead on internal logic propagation delay increases because internal logic is required to propagate over the input-output circuits. Furthermore, there has been a U.S. Pat. No. 5,341,049 as a related art.

SUMMARY OF THE INVENTION

An object of the present invention is to provide an input-output circuit cell by which input-output circuits can be arranged arbitrarily on a semiconductor chip.

Another object of the present invention is to provide a semiconductor integrated circuit apparatus in which propagation delay between an external interface unit and input-output circuits is small, so that overhead on internal logic propagation delay is small.

In order to achieve the above objects, according to an aspect of the present invention, provided is an input-output circuit cell comprising: an input-output circuit formed on a semiconductor chip and including a signal terminal, and an electric source terminal; and a plurality of input-output bumps connected to the signal and electric source terminals of the input-output circuit through wirings, wherein the plurality of input-output bumps are made to correspond to the input-output circuit and the input-output bumps are arranged at a center in a planes of projection of the input-output circuit. With such a configuration, input-output circuits can be arranged arbitrarily on a semiconductor chip.

In order to achieve the above objects, according to another aspect of the present invention, provided is an input-output circuit cell comprising: an input-output circuit formed on a semiconductor chip and including a signal terminal, and an electric source terminal; and a plurality of input-output bumps connected to the signal terminal and the electric source terminal of the input-output circuit through wirings respectively, wherein the plurality of input-output bumps are made to correspond to the input-output circuit, and the input-output bumps are arranged relative to the input-output circuit so that an area occupied by the plurality of input-output bumps is equal to an area occupied by the input-output circuit. With such a configuration, input-output circuits can be arranged arbitrarily on a semiconductor chip.

In order to achieve the above objects, according to a further aspect of the present invention, provided is a semiconductor integrated circuit apparatus comprising an input-output circuit unit formed on a semiconductor chip so as to be connected to an external interface unit, wherein: the input-output circuit unit includes a plurality of input-output circuit cells; each of the input-output circuit cells includes an input-output circuit having a signal terminal and an electric source terminal, and a plurality of input-output bumps connected to the signal and electric source terminals of the input-output circuit through wirings; and layout is made on the semiconductor chip with each input-output circuit cell, as a unit, having the plurality of input-output bumps made to correspond to the input-output circuit. With such a configuration, input-output circuits can be arranged arbitrarily on a semiconductor chip.

In the above semiconductor integrated circuit apparatus, preferably, the input-output circuit unit is disposed on two adjacent sides of the semiconductor chip so as to be L-shaped. In such a configuration, propagation delay between the external interface unit and the input-output circuits can be reduced to thereby reduce overhead on internal logic propagation delay.

DESCRIPTION OF THE PREFERRED EMBODIMENTS

Referring to FIGS. 1 through 6, a semiconductor integrated circuit apparatus according to an embodiment of the present invention will be described below.

Referring to FIGS. 1 through 6, a semiconductor integrated circuit apparatus according to an embodiment of the present invention will be described below.

Figure 1:
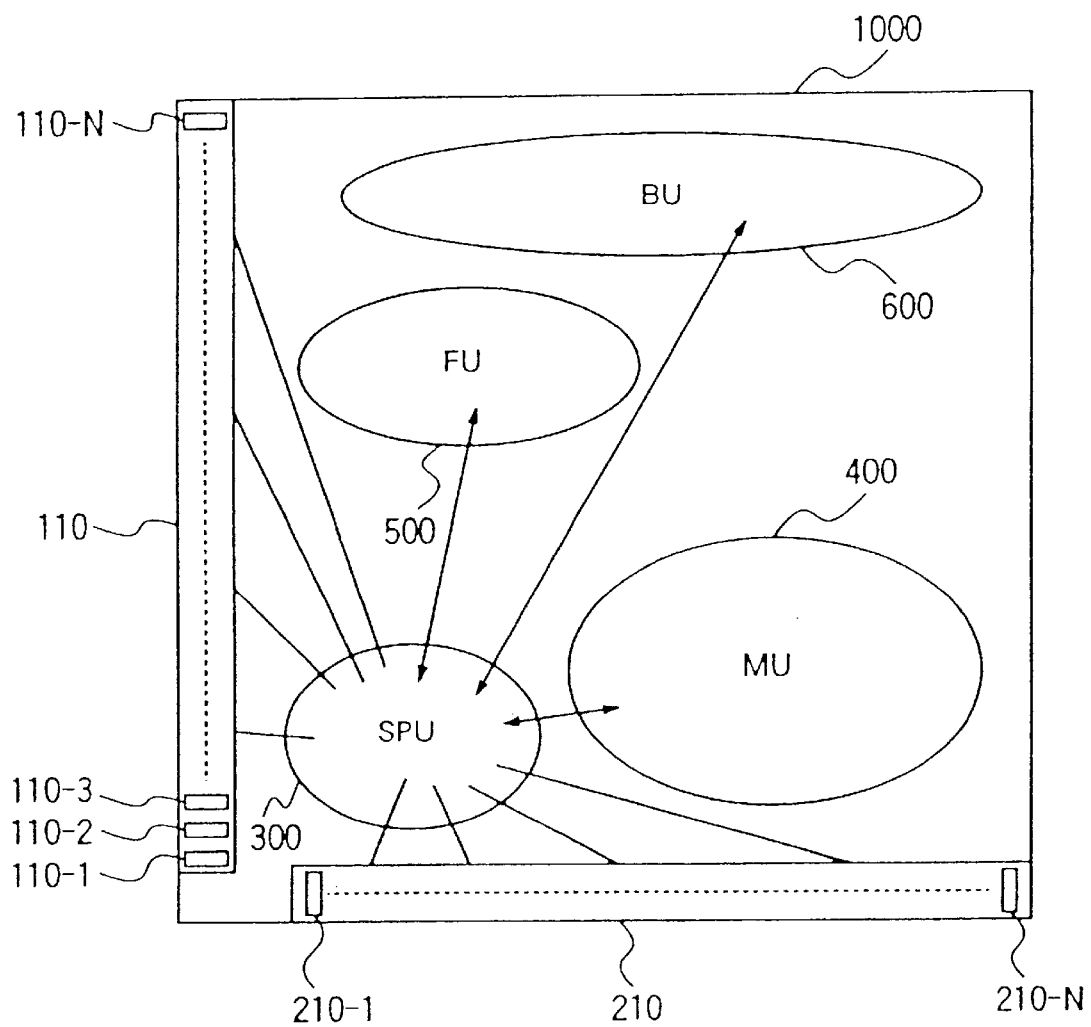
FIG. 1 is a diagram for explaining the arrangement of units on a semiconductor chip in a semiconductor integrated circuit apparatus according to an embodiment of the present invention.

Referring first to FIG. 1, the arrangement of units on a semiconductor chip in the semiconductor integrated circuit apparatus according to an embodiment of the present invention will be described.

FIG. 1 is a diagram for explaining the arrangement of units on a semiconductor chip in the semiconductor integrated circuit apparatus according to the embodiment of the present invention.

Input-output circuit units 110 and 210 are arranged so as to be L-shaped on the two sides, that is, left and lower sides of a semiconductor chip 1000 respectively. The input-output circuit unit 110 is constituted by N input-output circuits 110-1, 110-2, 110-3, . . . , 110-N. Similarly, the input-output circuit unit 210 is constituted by N input-output circuits 210-1, 210-2, 210-3, . . . , 210-N. Each of the input-output circuits 110-1, 110-2, 110-3, . . . , 110-N and 210-1, 210-2, 210-3, . . . , 210-N is an input circuit including an input buffer amplifier or an output circuit including an output buffer amplifier. The input circuit may include a bypass capacitor as a measure against electric source noise. The output circuit may include a termination resistor for making impedance matching with respective to an LSI external transmission system.

An SPU (Second cash and Processor bus control Unit) 300 which is an external interface unit is disposed at the left lower corner of the semiconductor chip 1000, that is, in the nearest position to the input-output circuit units 110 and 210 which are arranged so as to be L-shaped. Because the SPU 300 is disposed near the input-output circuit units 110 and 210, the distances between the SPU 300 and the input-output circuit units 110 and 210 can be reduced. Accordingly, propagation delay can be reduced compared with the conventional system having input-output circuits arranged at the periphery of a semiconductor chip.

An memory unit (MU) 400, an floating-point unit (FU) 500, a branch unit (BU) 600, etc. are arranged in the residual region of the semiconductor chip 1000. That is, the MU 400, the FU 500, the BU 600, etc. can be arranged collectively so as not to be separated by the input-output circuit units 110 and 210. Accordingly, overhead on internal logic propagation delay can be reduced compared with the conventional system having stripe-like input-output circuits arranged in the inside of a semiconductor chip.

Figure 2:
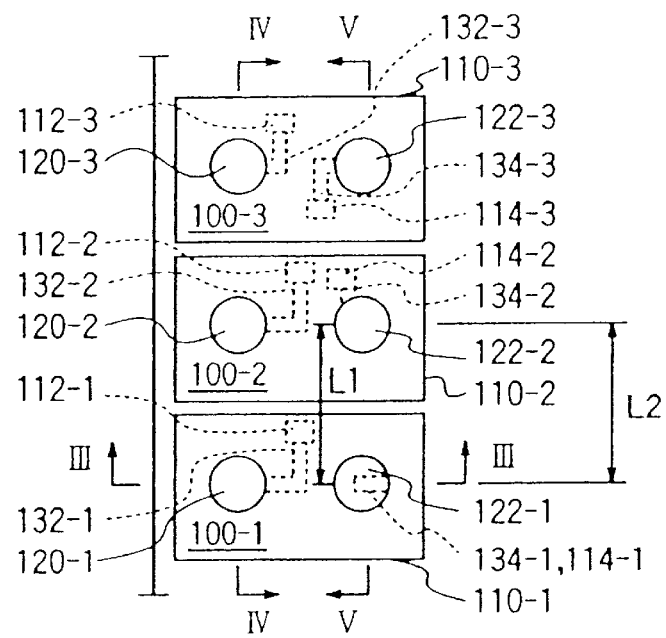
FIG. 2 is a diagram for explaining input-output circuit cells used in the semiconductor integrated circuit apparatus according to an embodiment of the present invention.

Referring next to FIG. 2, input-output circuits constituting the input-output circuit units 110 and 210 will be described.

FIG. 2 is a diagram for explaining input-output circuit cells used in the semiconductor integrated circuit apparatus according to an embodiment of the present invention.

FIG. 2 shows three input-output circuit cells 100-1, 100-2 and 100-3. The input-output circuit cell 100-1 is constituted by the input-output circuit 110-1 shown in FIG. 1, input-output bumps 120-1 and 122-1, and wirings 132-1 and 134-1 formed in a multilayer wiring substrate.

The sectional structure of the input-output circuit cell 100-1 will be described later in detail with reference to FIGS. 3 through 5. A multilayer wiring substrate containing wirings 132-1 and 134-1 formed therein is connected onto the input-output circuit 110-1. One end of the wiring 132-1 is connected to a signal terminal 112-1 formed in the input-output circuit 110-1. One end of the wiring 132-2 is connected to an electric source terminal 114-1 formed in the input-output circuit 110-1.

The input-output bumps 120-1 and 122-1 are formed on the multilayer wiring substrate containing the wirings 132-1 and 134-1 formed therein. The input-output bump 120-1 is connected to the other end of the wiring 132-1. The input-output bump 122-1 is connected to the other end of the wiring 134-1.

That is, the input-output bump 120-1 is connected, through the wiring 132-1, to a signal terminal 112-1 formed in the input-output circuit 110-1, so that the input-output bump 120-1 serves as a signal bump. The input-output bump 122-1 is connected, through the wiring 134-1, to an electric source terminal 114-1 formed in the input-output circuit 110-1, so that the input-output bump 122-1 serves as an electric source bump.

Similarly, the input-output circuit cell 100-2 is constituted by the input-output circuit 110-2 shown in FIG. 1, input-output bumps 120-2 and 122-2, and wirings 132-2 and 134-2 formed in the multilayer wiring substrate. The input-output bump 120-2 is connected, through the wiring 132-2, to a signal terminal 112-2 formed in the input-output circuit 110-2 whereas the input-output bump 122-2 is connected, through the wiring 134-2, to an electric source terminal 114-2 formed in the input-output circuit 110-2. Further, the input-output circuit cell 100-3 is constituted by the input-output circuit 110-3 shown in FIG. 1, input-output bumps 120-3 and 122-3, and wirings 132-3 and 134-3 formed in the multilayer wiring substrate. The input-output bump 120-3 is connected, through the wiring 132-3, to a signal terminal 112-3 formed in the input-output circuit 110-3 whereas the input-output bump 122-3 is connected, through the wiring 134-3, to an electric source terminal 114-3 formed in the input-output circuit 110-3.

Figure 3:
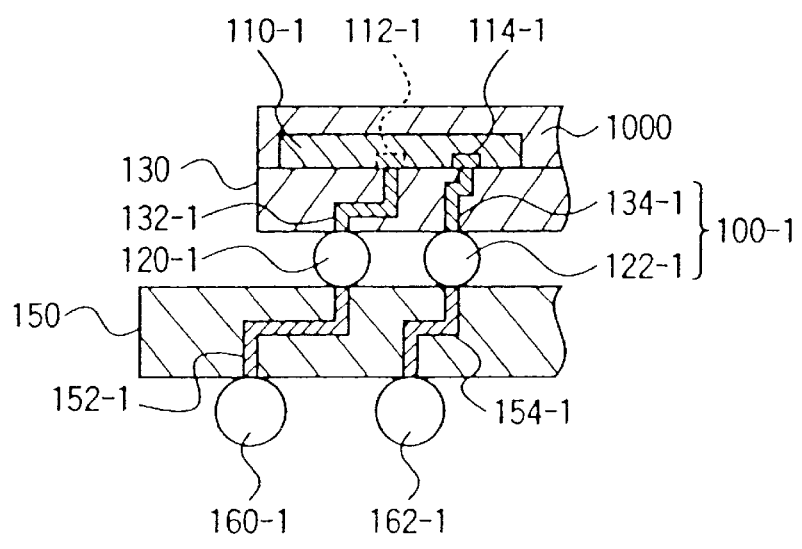
FIG. 3 is a section taken along the line III—III in FIG. 2 and showing input-output circuit cells used in the semiconductor integrated circuit apparatus according to an embodiment of the present invention.

Referring next to FIG. 3, the sectional structure of the input-output circuit cell 110-1 will be described.

FIG. 3 is a section taken along the line III—III in FIG. 2 and showing an input-output circuit cell used in the semiconductor integrated circuit apparatus according to an embodiment of the present invention.

The input-output circuit cell 110-1 is formed in the inside of the semiconductor chip 1000. A multilayer wiring substrate 130 is formed on the surface of the input-output circuit 110-1. The wirings 132-1 and 134-1 are formed in the multilayer wiring substrate 130. The wiring 132-1 is formed in the multilayer wiring substrate 130 so that one end of the wiring 132-1 is connected to the signal terminal 112-1 of the input-output circuit 110-1. The wiring 134-1 is also formed in the multilayer wiring substrate 130 so that one end of the wiring 134-1 is connected to the electric source terminal 114-1 of the input-output circuit 110-1. The input-output bumps 120-1 and 122-1 are formed at the other ends of the wirings 132-1 and 134-1 respectively. As described above, the input-output circuit cell 100-1 is constituted by the input-output circuit 110-1, the input-output bumps 120-1 and 122-1, and the wirings 132-1 and 134-1 formed in the multilayer wiring substrate 130.

The input-output bumps 120-1 and 122-1 are connected to respective ends of wirings 152-1 and 154-1 formed in a package substrate 150. The package substrate 150 is a multilayer wiring substrate. The other ends of the wirings 152-1 and 154-1 are connected to input-output pins 160-1 and 162-1 respectively.

Figure 4:
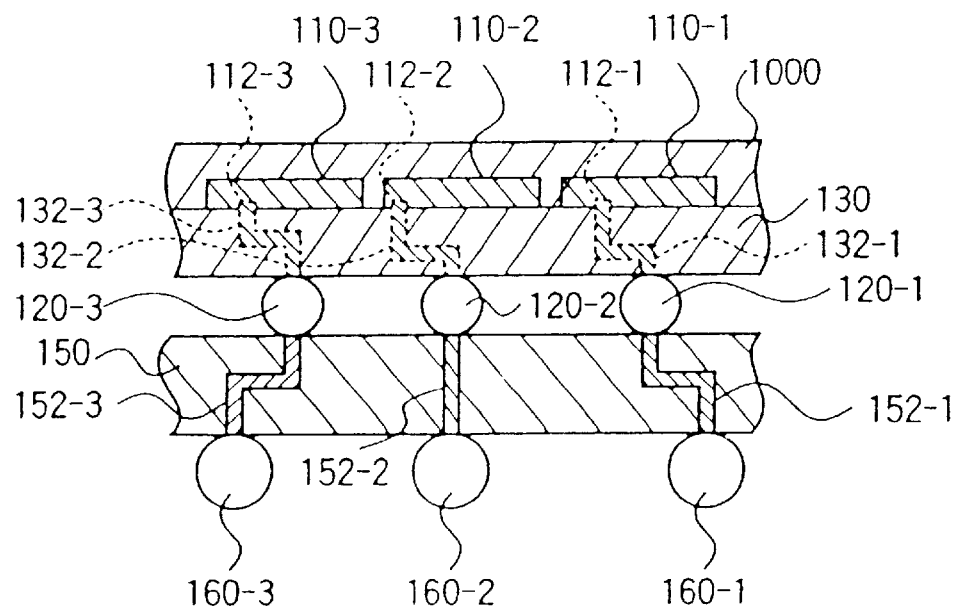
FIG. 4 is a section taken along the line IV—IV in FIG. 2 and showing a plurality of input-output circuit cells used in the semiconductor integrated circuit apparatus according to an embodiment of the present invention.

Referring next to FIG. 4, a sectional structure for the plurality of input-output circuit cells 110-1, 110-2 and 110-3 will be described below.

FIG. 4 is a section taken along the line IV—IV in FIG. 2 and showing a plurality of input-output circuit cells used in the semiconductor integrated circuit apparatus according to one embodiment of the present invention.

The input-output circuits 110-1, 110-2 and 110-3 are formed in the inside of the semiconductor chip 1000 so as to be arranged at equal intervals. The multilayer wiring substrate 130 is formed on the surface of the input-output circuits 110-1, 110-2 and 110-3. The wirings 132-1, 132-2 and 132-3 are formed in the multilayer wiring substrate 130. The wirings 132-1 and 134-1 are formed in the multilayer wiring substrate 130. The wiring 132-1 is formed in the multilayer wiring substrate 130 so that one end of the wiring 132-1 is connected to the signal terminal 112-1 of the input-output circuit 110-1. The wiring 132-2 is also formed in the multilayer wiring substrate 130 so that one end of the wiring 132-2 is connected to the signal terminal 112-2 of the input-output circuit 110-2. The wiring 132-3 is further formed in the multilayer wiring substrate 130 so that one end of the wiring 132-3 is connected to the signal terminal 112-3 of the input-output circuit 110-3. The input-output bumps 120-1, 120-2 and 120-3 are formed at the other ends of the wirings 132-1, 132-2 and 132-3 respectively.

As described above, the input-output bumps 120-1, 120-2 and 120-3 are located at the centers of the input-output circuits 110-1, 110-2 and 110-3 respectively, so that the positional relations between the input-output circuits 110-1, 110-2 and 110-3 and the input-output bumps 120-1, 120-2 and 120-3 are made constant for every input-output circuit cell. Even in the case where the signal terminals 112-1, 112-2 and 112-3 are provided in different positions correspondingly to the input-output circuits 110-1, 110-2 and 110-3 respectively, the positional relations between the input-output circuits 110 and the input-output bumps 120 can be made constant for every input-output circuit cell if the wiring shapes of the wirings 132-1, 132-2 and 132-3 interposed between the input-output circuits 110-1, 110-2 and 110-3 and the input-output bumps 120-1, 120-2 and 120-3 and disposed in the multilayer wiring substrate 130 are suitably designed.

The input-output bumps 120-1, 120-2 and 120-3 are connected to the respective one ends of the wirings 152-1, 152-2 and 152-3 formed in the package substrate 150. The other ends of the wirings 152-1, 152-2 and 152-3 formed in the package substrate 150 are connected to input-output pins 160-1, 160-2 and 160-3 respectively.

Figure 5:
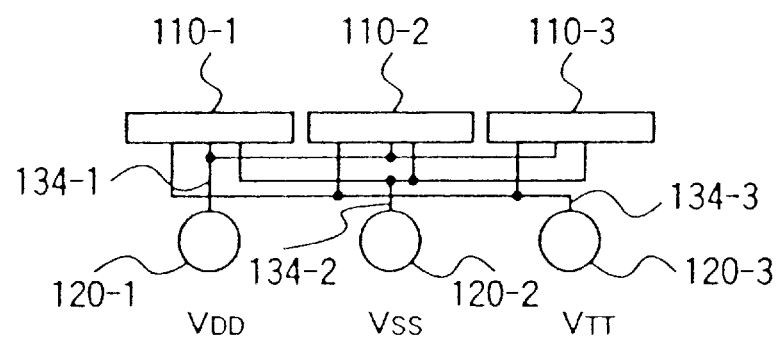
FIG. 5 is a section taken along the line V—V in FIG. 2 and typically showing the electric source side wiring connection structure of a plurality of input-output circuit cells used in the semiconductor integrated circuit apparatus according to an embodiment of the present invention.

Referring next to FIG. 5, the electric source side wiring connection structure for the plurality of input-output circuit cells 110-1, 110-2 and 110-2 will be described.

FIG. 5 is a section taken along the line V—V in FIG. 2 and typically showing an electric source side wiring connection structure for the plurality of input-output circuit cells used in the semiconductor integrated circuit apparatus according to one embodiment of the present invention.

Though not clearly shown in the description of the input-output circuits 110-1, 110-2 and 110-3 in FIG. 2, three kinds of electric source terminals are formed in the input-output circuits 110-1, 110-2 and 110-3 respectively. That is, the three kinds of electric source terminals are electric source terminals of the ground level $V_{SS}$, electric source terminals of the highest level $V_{DD}$ and electric source terminals of the intermediate level $V_{TT}$ between the ground level $V_{SS}$ and the highest level $V_{DD}$. The $V_{SS}$ electric source terminal, the $V_{DD}$ electric source terminal and the $V_{TT}$ electric source terminal are required to be supplied with different electric source voltages $V_{SS}$, $V_{DD}$ and $V_{TT}$ respectively. Therefore, for example, the electric source voltage $V_{DD}$ supplied from the input-output bump 122-1 shown in FIG. 2 is distributed to the three input-output circuits 110-1, 110-2 and 110-3. Similarly, the electric source voltage $V_{SS}$ supplied from the input-output bump 122-2 is distributed to the three input-output circuits 110-1, 110-2 and 110-3 and the electric source voltage $V_{TT}$ supplied from the input-output bump 122-3 is distributed to the three input-output circuits 110-1, 110-2 and 110-3.

FIG. 5 shows the aforementioned wiring relations. That is, as shown in FIG. 4, the bump 120-1 is connected, through the wiring 132-1, to the electric source terminal 112-1 of the input-output circuit 110-1. Assuming now that the electric source terminal 112-1 is a $V_{DD}$ electric source voltage, then the wiring 132-1 is also connected to the $V_{DD}$ electric source terminals of the other input-output circuits 110-1 and 110-3. Similarly, assuming now that the electric source terminal 112-2 is a $V_{SS}$ electric source terminal, then the input-output bump 120-2 is connected, through the wiring 132-2, to the electric source terminal 112-2 of the input-output circuit 110-2 and also to the $V_{SS}$ electric source terminals of the input-output circuits 110-1 and 110-3. Assuming further now that the electric source terminal 112-3 is a $V_{TT}$ electric source terminal, then the input-output bump 120-3 is connected, through the wiring 132-3, to the electric source terminal 112-3 of the input-output circuit 110-3 and also to the $V_{TT}$ electric source terminals of the input-output circuits 110-1 and 110-2.

As described above, in this embodiment, the input-output bumps 120-1, 122-1, 120-2, 122-2, 120-3 and 122-3 are disposed in center positions in planes of projection of the input-output circuits 110-1, 110-2 and 110-3 respectively as shown in FIG. 2. Accordingly, the pitch interval L1 of the input-output bumps is equal to the pitch interval L2 of the input-output circuits. A plurality of input-output bumps and a plurality of input-output circuits need be arranged collectively in design of layout in the conventional method whereas input-output circuits can be arranged independently in arbitrary positions in this embodiment. That is, in this embodiment, a bump and an input-output circuit are used in combination as a unit in design of layout, so that the arrangement of input-output bumps and the arrangement of input-output circuits in an LSI are made equivalent to each other. Accordingly, the arrangement of input-output bumps and the arrangement of input-output circuits in an LSI need not be considered independently. Because an LSI designer can consider only the arrangement of input-output circuit cells in necessary positions, the LSI designer can design the layout of the LSI easily.

Further, because input-output circuits can be arranged in arbitrary positions, the input-output circuits 110-1, . . . , 110-N, 210-1, . . . , 210-N can be arranged on the two sides of the semiconductor chip 1000 so as to be L-shaped as shown in FIG. 1.

Accordingly, because the SPU 200 can be deposed in the nearest position to the input-output circuit units 110 and 210 which are arranged so as to be L-shaped, the distances between the SPU 200 and the input-output circuit units 110 and 210 can be reduced. Accordingly, propagation delay can be reduced compared with the system having input-output circuits arranged in the periphery of a semiconductor chip.

Further, when the MU 400, the FU 500, and BU 600, etc. are arranged in the residual region of the semiconductor chip 1000, these units can be arranged collectively so as not to be separated by the input-output circuit units 110 and 210. Accordingly, overhead on internal logic propagation delay can be reduced compared with the system having stripe-like input-output circuits arranged in the inside of a semiconductor chip.

When the pitch interval L1 of input-output bumps and the pitch interval L2 of input-output circuits are both selected to be 150 μm in this embodiment though the original pitch interval of input-output bumps is 300 μm, input-output pins as many as in the case where input-output circuits are arranged on four corners of a semiconductor chip can be obtained. Further, when input-output circuits arranged in each of L-shaped sides are arranged not in one line as shown in FIG. 1 but in two parallel lines, the number of input-output pins can be doubled.

The input-output bumps 120-1, 122-1, 120-2, 122-2, 120-3 and 122-3 are connected to the signal terminals 112-1, 112-2 and 112-3 and electric source terminals 114-1, 114-2 and 114-3 of the input-output circuits 110-1, 110-2 and 110-3 respectively and to the wirings 132-1, 134-1, 132-2, 134-2, 133-3 and 134-3 formed in the multilayer wiring substrate. Accordingly, when the positions of the wirings 132-1, 134-1, 132-2, 134-2, 132-3 and 134-3 are changed, the input-output bumps 120-1, 122-1, 120-2, 122-2, 120-3 and 122-3 can be arranged in center positions of the input-output circuits 110-1, 110-2 and 110-3 respectively regardless of the arrangement positions of the signal terminals 112-1, 112-2 and 112-3 and electric source terminals 114-1, 114-2 and 114-3 in the input-output circuits 110-1, 110-2 and 110-3.

Figure 6:
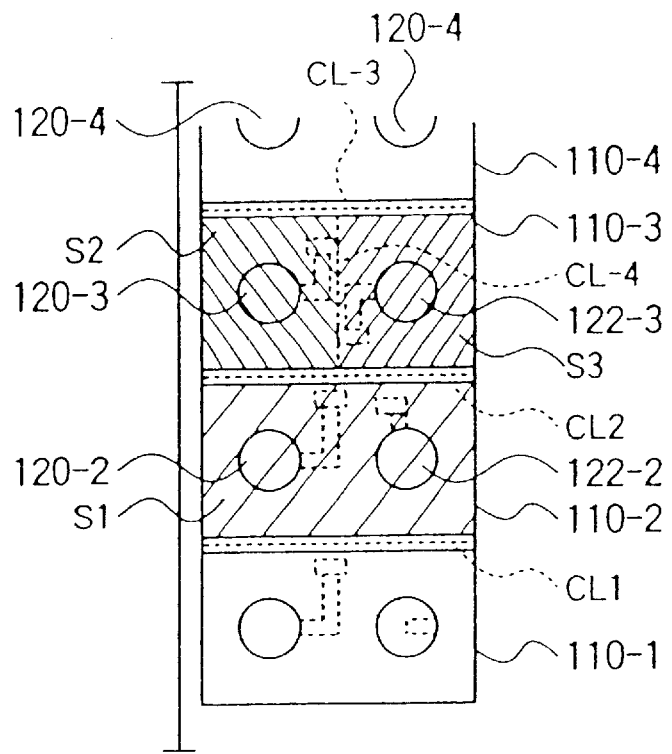
FIG. 6 is a diagram for explaining the positional relation between input-output bumps and input-output circuits in input-output circuit cells used in the semiconductor integrated circuit apparatus according to an embodiment of the present invention.

Referring next to FIG. 6, the positional relation between the input-output bumps 120 and the input-output circuits 110 will be described from another point of view.

FIG. 6 is a diagram for explaining the positional relation between the input-output bumps and the input-output circuits in input-output circuit cells used in the semiconductor integrated circuit apparatus according to an embodiment of the present invention.

In this embodiment, a combination of two input-output bumps has one-to-one correspondence with one input-output circuit so that the area occupied by two input-output bumps is made equal to the area occupied by one input-output circuit. This point will be described with reference to FIG. 6.

The "area occupied by one input-output circuit" used herein means an area which is occupied by a certain input-output circuit when the certain input-output circuit is disposed so as to be adjacent to another input-output circuit and a middle line between the certain input-output circuit and the other input-output circuit is defined as a boundary therebetween. That is, since the input-output circuit 110-2 is adjacent to each of the input-output circuits 110-1 and 110-3 as shown in FIG. 6, the broken line CL-1 expressing the middle line between the input-output circuits 110-1 and 110-2 is defined as a boundary therebetween and the broken line CL-2 expressing the middle line between the input-output circuits 110-3 and 110-2 is defined as a boundary therebetween. With respect to the left and right boundaries, the left and right ends of the input-output circuit 110-2 are defined as the boundaries. In this occasion, the area S1 of the hatched region is defined as the area occupied by the input-output circuit 110-2.

On the other hand, the "area occupied by one input-output bump" used herein means the area which is occupied by a certain input-output bump when the certain input-output bump is arranged so as to be adjacent to another input-output bump and the middle line between the certain input-output bump and the other input-output bump is defined as a boundary therebetween. That is, since the input-output bump 120-3 is adjacent to the input-output bumps 120-2, 120-4 and 122-3 as shown in FIG. 6, the broken line CL-2 expressing the middle line between the input-output bumps 120-2 and 120-3 is defined as a boundary therebetween, the broken line CL-3 expressing the middle line between the input-output bumps 120-3 and 120-4 is defined as a boundary therebetween and the broken line CL-4 expressing the middle line between the input-output bumps 120-3 and 122-3 is defined as a boundary therebetween. With respect to the left boundary, the left end portion of the input-output circuit 110-2 is defined as a left boundary. In this occasion, the area S2 of the hatched region is defined as the area occupied by the input-output bump 120-3. Similarly, the area S3 of the hatched region is defined as the area occupied by the input-output bump 122-3. The area occupied by the input-output bump 120-2 is equal to the area S2 whereas the area occupied by the input-output bump 122-3 is equal to the area S3.

Because a combination of two input-output bumps 120-2 and 122-2 has one-to-one correspondence with one input-output circuit 110-2, the area (S2+S3) occupied by the two input-output bumps is made equal to the area S1 occupied by the input-output circuit.

In this embodiment, because a combination of input-output bumps are arranged so as to correspond to one input-output circuit so that the area occupied by the combination of input-output bumps is made equal to the area occupied by the input-output circuit, individual input-output circuits can be arranged in arbitrary positions independently.

Further, because the SPU can be disposed in the nearest position to the input-output circuit units which are arranged so as to be L-shaped, propagation delay can be reduced compared with the system having input-output circuits arranged in the periphery of a semiconductor chip.

Further, because the MU, the FU, and BU, etc. can be arranged collectively so as not to be separated by the input-output circuit units, overhead on internal logic propagation delay can be reduced.

Although the above description has been made about the case where the input-output bumps 120-1, 120-2 and 120-3 in the left row shown in FIG. 2 are connected to signal terminals and the input-output bumps 122-1, 122-2 and 122-3 in the right row shown in FIG. 2 are connected to electric source terminals, the present invention may be applied also to the case where the bumps are connected alternately to signal terminals and electric source terminals. That is, the input-output bumps 120-1, 122-2 and 120-3 may be connected to signal terminals and the input-output bumps 122-1, 120-2 and 122-3 may be connected to electric source terminals. In such connecting relation, not only the distances between the input-output bumps 120-1, 122-2 and 120-3 connected to signal terminals can be increased but also relatively stable electric source lines are interposed between the signal lines. Accordingly, the interference of signals with each other can be reduced.

As described above, the arrangement of input-output circuits and input-output bumps can be made in the same manner as in the floor plan of internal logic of an LSI, or the like. Accordingly, overhead on the input-output circuits is reduced, so that the floor plan to bring out the best performance of the LSI can be made. That is, improvement in the performance of the semiconductor integrated circuit apparatus can be attained effectively.

In this embodiment, individual input-output circuits can be arranged in arbitrary positions respectively independently of each other.

Further, because the SPU can be arranged in the nearest position to the input-output circuit units which are arranged so as to be L-shaped, propagation delay can be reduced compared with the system having input-output circuits arranged on the periphery of a semiconductor chip.

Further, because the MU, the FU, the BU, etc. can be arranged collectively so as not to be separated by the input-output circuit units, overhead on internal logic propagation delay can be reduced.

Figure 7:
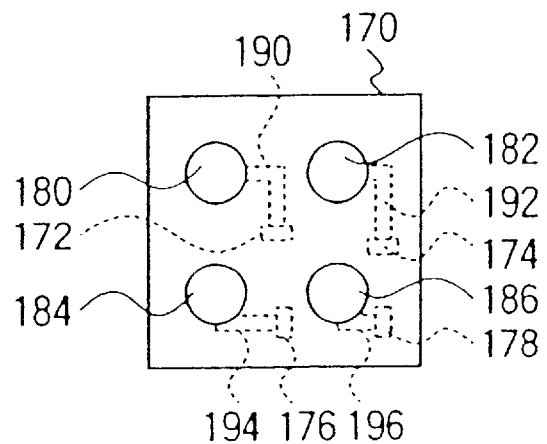
FIG. 7 is a diagram for explaining an input-output circuit cell used in the semiconductor integrated circuit apparatus according to another embodiment of the present invention.

Referring next to FIG. 7, an input-output circuit cell according to another embodiment of the present invention will be described.

FIG. 7 is a diagram for explaining an input-output circuit cell used in the semiconductor integrated circuit apparatus according to another embodiment of the present invention.

The input-output circuit cell is configured so that four input-output bumps 180, 182, 184 and 186 correspond to one input-output circuit 170. The input-output bump 180 is connected, through a wiring 190 formed in a multilayer wiring substrate, to a signal terminal 172 formed in the input-output circuit 170, so that the input-output bump 180 serves as a signal bump. The input-output bump 182 is connected, through a wiring 192, to a $V_{DD}$ electric source terminal 174 formed in the input-output circuit 170, so that the input-output bump 182 serves as a $V_{DD}$ electric source bump. The input-output bump 184 is connected, through a wiring 194, to a $V_{SS}$ electric source terminal 176 formed in the input-output circuit 170, so that the input-output bump 184 serves as a $V_{SS}$ electric source bump. The input-output bump 186 is connected, through a wiring 196, to a $V_{TT}$ electric source terminal 178 formed in the input-output circuit 170, so that the input-output bump 186 serves as a $V_{TT}$ electric source bump.

Accordingly, as described above with reference to FIG. 5, the wiring for distributing an electric source from one electric source bump to electric source terminals of three input-output circuits becomes unnecessary.

Figure 8:
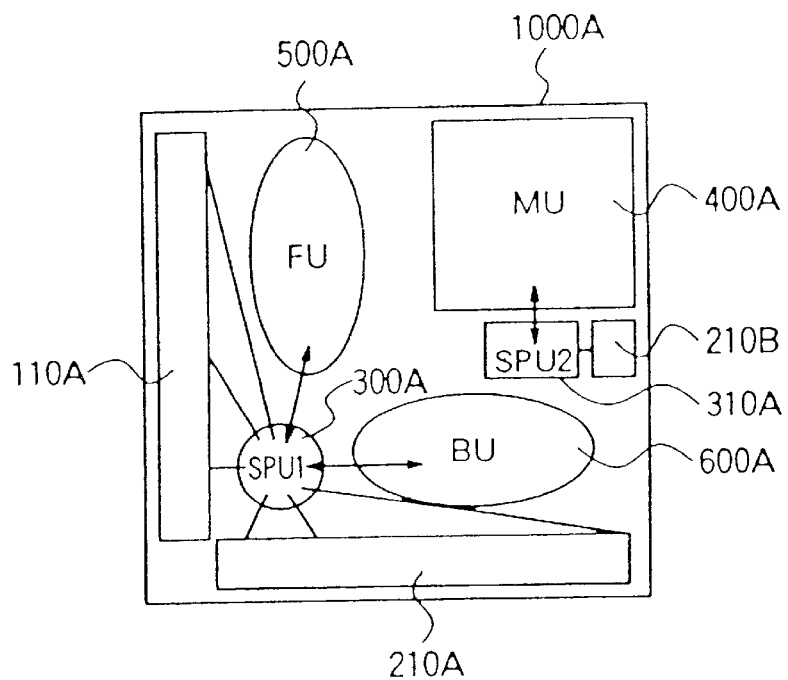
FIG. 8 is a diagram for explaining the arrangement of units on a semiconductor chip in the semiconductor integrated circuit apparatus according to a further embodiment of the present invention.

Referring next to FIG. 8, the arrangement of respective units on a semiconductor chip in the semiconductor integrated circuit apparatus according to another embodiment of the present invention will be described.

FIG. 8 is a diagram for explaining the arrangement of units on a semiconductor chip in the semiconductor integrated circuit apparatus according to another embodiment of the present invention.

Input-output circuit units 110A and 210A are arranged on one left side and one lower side, that is, two sides in total, of a semiconductor chip 1000A so as to be L-shaped. The input-output circuit unit 110A is constituted by a plurality of input-output circuits as shown in FIG. 1. Similarly, the input-output circuit unit 210A is constituted by a plurality of input-output circuits. A first SPU 300A which is an external interface unit is disposed at the left lower corner of the semiconductor chip 1000A, that is, in the nearest position to the input-output circuit units 110A and 210A which are arranged so as to be L-shaped. Because the SPU 300A is arranged near the input-output circuit units 110A and 210A, the distances between the SPU 300A and the input-output circuit units 110A and 210A can be reduced. Accordingly, propagation delay can be reduced compared with the system having input-output circuits arranged on the periphery of a semiconductor chip.

A memory unit (MU) 400A, a floating-point unit (FU) 500A, a branch unit (BU) 600A, etc. are arranged in the residual region of the semiconductor chip 1000A. In this occasion, the FU 500A and the BU 600A are connected to the SPU 300A.

Because the MU 400A is, however, disposed so as to be far from the SPU 300A, an SPU 310A is newly disposed near the MU 400A. An input-output circuit 210B is arranged near the SPU 310A. Because the MU 400A can be designed so that the number of terminals for interface connection to the outside reduced, the input-output circuit 210B can be arranged in an arbitrary position as described above.

In this embodiment, the input-output circuit cell constituted by the input-output circuits 110A, 210A and 210B is configured as shown in FIGS. 2 to 4. Accordingly, individual input-output circuits can be arranged in arbitrary positions independently, so that the input-output circuit 210B can be arranged newly in an optimum position.

Figure 9:
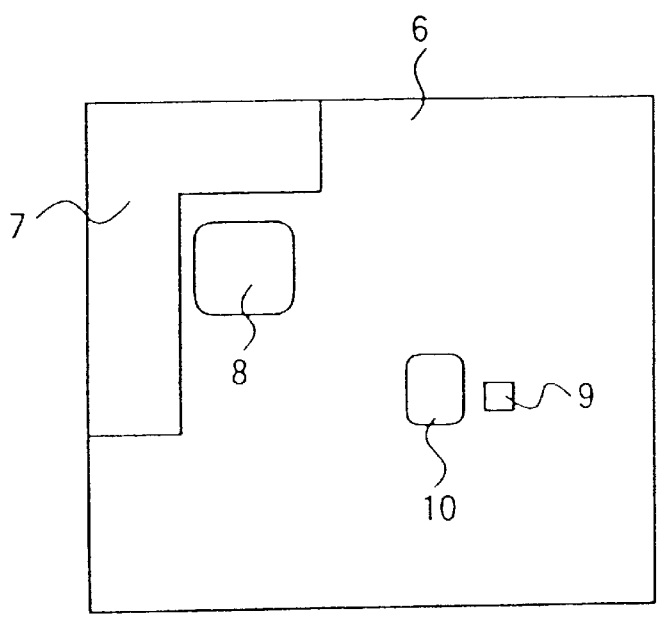
FIG. 9 is a diagram for explaining the arrangement of units on a semiconductor chip in the semiconductor integrated circuit apparatus according to a further embodiment of the present invention.

Referring next to FIG. 9, a further embodiment of the present invention will be described.

An L-shaped input-output circuit unit 7 is arranged at an upper portion of the left side of a semiconductor chip 6 and at a left portion of the upper side of the same chip 6. The input-output circuit unit 7 is constituted by a plurality of input-output circuit cells. An external interface unit 8 is arranged in a position near the input-output circuit unit 7 which is disposed so as to be L-shaped. Because the external interface unit 8 is arranged near the input-output circuit unit 7, propagation delay can be reduced compared with the conventional system having input-output circuits arranged on the periphery of a semiconductor chip.

Further, an input-output circuit unit 9 is arranged near the center portion of the semiconductor chip 6. An external interface unit 10 is arranged near the input-output circuit unit 9. As described above, such an input-output circuit unit can be disposed in an arbitrary position.

According to the present invention, input-output circuits can be arranged arbitrarily on a semiconductor chip.

Further, according to the present invention, propagation delay between an external interface unit and an input-output circuit in the semiconductor integrated circuit apparatus is small, so that overhead on internal logic propagation delay can be reduced.

We claim:

1. A semiconductor integrated circuit apparatus to be formed on a semiconductor chip, comprising:
   a logical unit;
   a memory unit;
   an interface unit forming an interface between said logical unit and memory unit, and an external unit; and
   an input/output circuit unit forming a buffer between said interface unit and said semiconductor chip,
   wherein
   said input/output circuit unit is disposed an with L-shaped form along two edges adjacent to said semiconductor,
   wherein
   said interface unit is disposed adjacent to said input/output circuit unit disposed with the L-shaped form; and wherein
   said logical unit and said memory unit are disposed on a chip region other than a region on which said input/output circuit unit and said interface unit are disposed.

2. A semiconductor integrated circuit apparatus according to claim 1, wherein said input/output circuit unit includes a plurality of input/output circuits arranged in a row.

3. A semiconductor integrated circuit apparatus according to claim 2, wherein said input/output circuit includes one of an input circuit having an input buffer amplifier and an output circuit having an output buffer amplifier.

4. A semiconductor integrated circuit apparatus according to claim 3, wherein said input circuit includes a bypass capacitor used for a measure of power source noise.

5. A semiconductor integrated circuit apparatus according to claim 3, wherein said output circuit includes a terminating resistor used for impedance matching.

6. A semiconductor integrated circuit apparatus according to claim 1, wherein said input/output circuit unit disposed with the L-shaped form is disposed on a part of each of said two edges of said semiconductor chip.

7. A semiconductor integrated circuit apparatus according to claim 2, wherein said input/output circuit unit disposed with the L-shaped form includes a plurality of rows in parallel, each row including said input/output circuit.

* * * * *